(12) United States Patent
Rostaing et al.

(10) Patent No.: US 10,348,284 B2
(45) Date of Patent: Jul. 9, 2019

(54) SUMMING CIRCUIT

(71) Applicant: Commissariat à l'Énergie Atomique et aux Énergies Alternatives, Paris (FR)

(72) Inventors: Jean-Pierre Rostaing, La Côte Saint Andre (FR); Bertrand Dupont, Sassenage (FR); Nicolas Monnier, Grenoble (FR); Jean-Alain Nicolas, Saint Egreve (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/714,611

(22) Filed: Sep. 25, 2017

(65) Prior Publication Data

US 2018/0091129 A1    Mar. 29, 2018

(30) Foreign Application Priority Data

Sep. 26, 2016   (FR) ...................................... 16 59032

(51) Int. Cl.
*G01J 5/10*        (2006.01)
*H03K 5/24*        (2006.01)
(Continued)

(52) U.S. Cl.
CPC .............. *H03K 5/2472* (2013.01); *G01J 5/10* (2013.01); *G06G 7/1865* (2013.01);
(Continued)

(58) Field of Classification Search
CPC ......... G01J 2005/0077; G01J 2005/106; G01J 5/10; G06G 7/14; G06G 7/1865; H03K 3/3565; H03K 5/2472
See application file for complete search history.

(56) References Cited

U.S. PATENT DOCUMENTS

| | | | |
|---|---|---|---|
| 3,950,989 A * | 4/1976 | Meirowitz | .......... G01F 15/0755 73/861.77 |
| 4,086,656 A | 4/1978 | Brown | |

(Continued)

FOREIGN PATENT DOCUMENTS

| | | |
|---|---|---|
| GB | 2 220 771 A | 1/1990 |
| WO | WO 2007/003577 A1 | 1/2007 |
| WO | WO 2015/040316 A1 | 3/2015 |

OTHER PUBLICATIONS

French Search Report for Application No. 16/59032 dated Jul. 11, 2017.

(Continued)

*Primary Examiner* — Marcus H Taningco
(74) *Attorney, Agent, or Firm* — Wolf, Greenfield & Sacks, P.C.

(57) ABSTRACT

A summing circuit, including a capacitor, a switching circuit capable of connecting the capacitor between a first node (ana) and a second node (ref), between a third node and the second node in a first connection direction or between the third node and the second node in a second connection direction, an integrator coupled to the third node, a hysteresis comparator coupled to the output of the integrator, and a counter coupled to the output of the hysteresis comparator.

13 Claims, 5 Drawing Sheets

(51) Int. Cl.
*H03K 3/3565* (2006.01)
*G06G 7/186* (2006.01)
*G01J 5/00* (2006.01)
*G06G 7/14* (2006.01)

(52) U.S. Cl.
CPC .... *H03K 3/3565* (2013.01); *G01J 2005/0077* (2013.01); *G01J 2005/106* (2013.01); *G06G 7/14* (2013.01)

(56) References Cited

U.S. PATENT DOCUMENTS

| | | | |
|---|---|---|---|
| 2004/0017224 A1* | 1/2004 | Tumer | H03F 3/087 327/51 |
| 2007/0252575 A1 | 11/2007 | Miaille | |
| 2008/0018806 A1* | 1/2008 | Inoue | G08C 23/04 348/734 |
| 2008/0112711 A1* | 5/2008 | Inoue | H03F 3/087 398/202 |
| 2016/0216202 A1* | 7/2016 | Rostaing | G01S 17/89 |
| 2017/0005667 A1* | 1/2017 | Shirahama | H03M 1/34 |

OTHER PUBLICATIONS

Domingues et al., A CMOS THz Staring Imager with In-pixel Electronics. PH.D. Research in Microelectronics and Electronics (Prime), 2011. $7^{th}$ Conference on IEEE. Jul. 3, 2011;81-4.

* cited by examiner

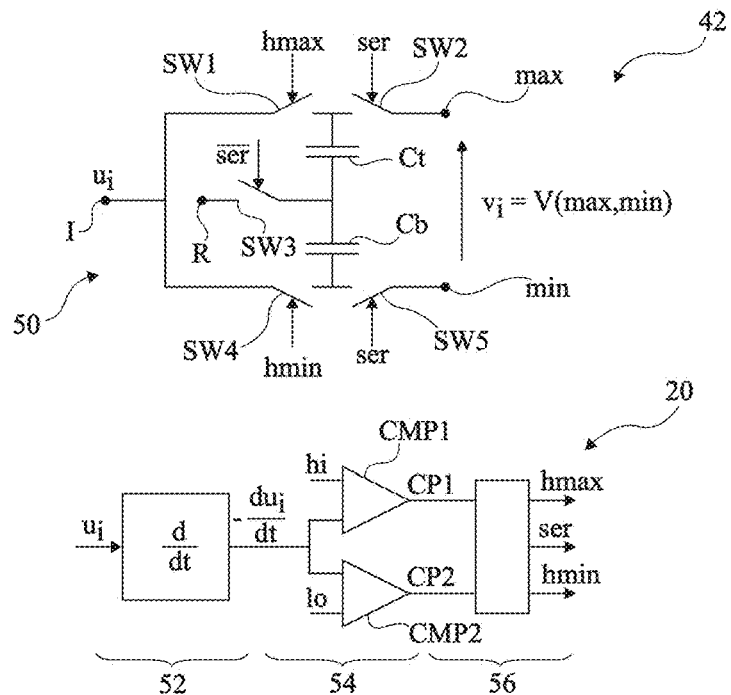
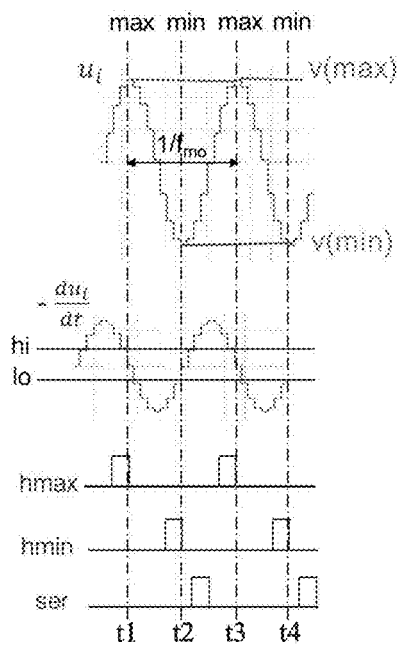
Fig 4
Fig 5

SUMMING CIRCUIT

CROSS-REFERENCE TO RELATED APPLICATION

This application claims priority to French Application No. 16/59032, filed Sep. 26, 2016, which is incorporated herein by reference to the maximum extent allowable by law

BACKGROUND

The present application relates to a summing circuit receiving successive input signals and supplying an output signal representative of the sum of the successive input signals.

DISCUSSION OF THE RELATED ART

For certain applications, it is desirable to have a summing circuit with large dynamic range.

FIG. 1 shows a known example of a summing circuit 10, also called integrator, summing integrator, or integrating circuit. Summing circuit 10 comprises an input node IN receiving an analog signal to be summed. Circuit 10 comprises two capacitors Ca and Cb and an operational amplifier G. A plate of capacitor Ca is coupled to node IN by a switch swa controlled by a binary signal pha and is coupled to a node r by a switch swb controlled by a binary signal phb. Node r is kept at a constant reference potential. The other plate of capacitor Ca is coupled to the inverting input (−) of operational amplifier G by a switch swc controlled by signal phb and is coupled to node r by a switch swd controlled by signal pha. The non-inverting input (+) of operational amplifier G is coupled to node r. A plate of capacitor Cb is coupled to the inverting input (−) of operational amplifier G and the other plate of capacitor Cb is coupled to output OUT of operational amplifier G. A switch swe controlled by a binary signal phc is provided across capacitor Cb.

The operation of summing circuit 10 comprises a succession of cycles. Before the first cycle, switch swe is turned on to reset the voltage across capacitor Cb. Each operating cycle of summing circuit 10 comprises the following successive steps:

switches swa and swd are turned on and switches swb and swc are turned off. This causes the charge of capacitor Ca with voltage V(in)−V(r), noted V(in,r). Electric charge Q stored by capacitor Ca is thus equal to product Ca·V(in,r);

switches swa and swd are turned off and switches swb and swc are turned on. Capacitor Ca is assembled between node r and the inverting input (−) of operational amplifier G, which is at potential V(r) equal to V(+). Capacitor Ca then discharges into capacitor Cb, which thus takes charge Q. Voltage V(out,r) across capacitor Cb thus increases by value Q/Cb, that is, by value V(in,r)·Ca/Cb.

Voltage V(out,r) thus follows the following relation (1):

$$V(\text{out}, r) = \frac{1}{Cb} \sum_{i=1}^{K} Q_i = \frac{Ca}{Cb} \sum_{i=1}^{K} V_i(\text{in}, r) \quad (1)$$

For certain applications, the total charge $Q_{PE}$ which is equal to the sum of elementary charges $Q_i$ may be greater than a few nanocoulombs, that is, a several thousands of pF·V. Summing circuit 10 should thus have a dynamic range $Q_{PE}/Q_i$ greater than $10^6$, that is, greater than 120 dB.

In practice, the dynamic range of summing circuit 10 is limited by:

capacitance ratio Ca/Cb; and voltage excursion E of summing circuit 10 which is smaller than power supply voltage Vdd of summing circuit 10.

As an example, when summing circuit 10 is formed by conventional integrated circuit manufacturing methods, for example, by implementing a technology for which the gate length of the metal oxide semiconductor field-effect or MOSFET transistors is 130 nm, the minimum capacitance which can be obtained may be in the order of 30 fF, the maximum capacitance which can be obtained may be in the order of 3 pF, and power supply voltage Vdd may be in the order of 1.2 V. Ratio Ca/Cb is then smaller than 100 and voltage excursion E is also smaller than 1 V. It is thus impossible to reach a charge of several thousands of pF·V with a summing circuit having the structure shown in FIG. 1.

SUMMARY

An object of an embodiment is to provide a summing circuit overcoming all or part of the disadvantages of existing summing circuits.

Another object of an embodiment is for the summing circuit to have a dynamic range greater than $10^6$.

Another object of an embodiment is for the summing circuit to enable to determine a total charge, corresponding to the sum of elementary charges, which is greater than several thousands of pF·V.

Another object of an embodiment is that the summing circuit can be formed by conventional integrated circuit manufacturing methods.

Thus, an embodiment provides a summing circuit comprising:

a capacitor;

a switching circuit capable of connecting the capacitor between a first node and a second node, between a third node and the second node in a first connection direction or between the third node and the second node in a second connection direction;

an integrator coupled to the third node;

a hysteresis comparator coupled to the output of the integrator; and a counter coupled to the output of the hysteresis comparator.

According to an embodiment, the integrator is capable of supplying a first signal and the hysteresis comparator is capable of supplying a second signal in a first state or in a second state according to the result of the comparison of the first signal with a first threshold or with a second threshold.

According to an embodiment, the counter is capable of incrementing a digital signal for each rising edge and for each falling edge of the second signal.

According to an embodiment, the integrator comprises an operational amplifier.

According to an embodiment, the switching circuit comprises:

a first switch coupling a first plate of the capacitor to the first node and controlled by a first control signal;

a second switch coupling a second plate of the capacitor to the second node and controlled by the first control signal;

a third switch coupling the first plate of the capacitor to the third node and controlled by a second control signal;

a fourth switch coupling the second plate of the capacitor to the second node and controlled by the second control signal;

a fifth switch coupling the first plate of the capacitor to the third node and controlled by a third control signal; and a sixth switch coupling the second plate of the capacitor to the second node and controlled by the third control signal.

According to an embodiment, the summing circuit further comprises a sequencer capable of controlling the first, second, third, fourth, fifth, and sixth switches according to one of the following configurations a), b), and c):

a) first and second switches in the on state and third, fourth, fifth, and sixth switches in the off state;

b) third and fourth switches in the on state and first, second, fifth, and sixth switches in the off state; and c) fifth and sixth switches in the on state and first, second, third, and fourth switches in the off state.

According to an embodiment, the sequencer is capable of controlling the first, second, third, fourth, fifth, and sixth switches to configuration a) when a new value is applied between the first and second nodes.

According to an embodiment, the sequencer is capable of controlling the first, second, third, fourth, fifth, and sixth switches from configuration b) to configuration c) or from configuration c) to configuration b) when the signal reaches the first threshold or the second threshold.

An embodiment also provides a processing and sum determination circuit comprising a processing circuit capable of receiving a noisy analog signal and capable of supplying a succession of constant values from the noisy analog signal; and the summing circuit such as previously defined capable of receiving the succession of constant values.

According to an embodiment, the analog signal is an oscillating signal and the constant values are representative of the peak-to-peak amplitude of the analog signal for successive oscillations.

An embodiment also provides an electromagnetic radiation detection system comprising a detector of the electromagnetic radiation and a processing and sum determination circuit such as previously defined.

According to an embodiment, the detection circuit comprises an array of detectors of the electromagnetic radiation and, for each detector, a processing and sum determination circuit such as previously defined.

According to an embodiment, the frequency of the electromagnetic radiation is in the range from 100 GHz to 30 THz.

BRIEF DESCRIPTION OF THE DRAWINGS

The foregoing and other features and advantages will be discussed in detail in the following non-limiting description of specific embodiments in connection with the accompanying drawings, among which:

FIG. 4 partially and schematically shows an embodiment of an amplitude extraction circuit of the processing and sum determination circuit of FIG. 3;

FIG. 5 shows curves of the variation of signals during the operation of the amplitude extraction circuit of FIG. 4;

DETAILED DESCRIPTION

Figure 1:
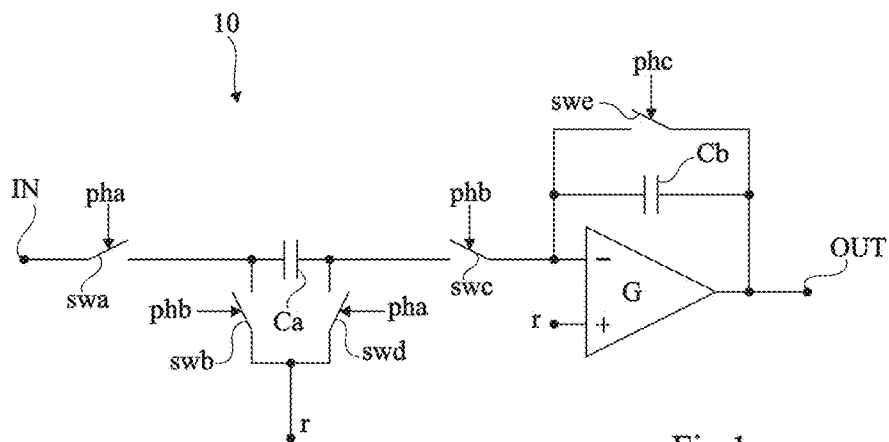
FIG. 1, previously described, shows an example of an integrating circuit.

The same elements have been designated with the same reference numerals in the various drawings and, further, the various drawings are not to scale. For clarity, only those steps and elements which are useful to the understanding of the described embodiments have been shown and are detailed. In particular, terahertz radiation sources are systems well known in the art and will not be described in detail hereafter. Unless otherwise specified, expression "in the order of" means to within 10%, preferably to within 5%.

Further, a signal which alternates between a first constant state, for example, a low state, noted "0", and a second constant state, for example, a high state, noted "1", is called "binary signal". The high and low states of different binary signals of a same electronic circuit may be different. In particular, the binary signals may correspond to voltages or to currents which may not be perfectly constant in the high or low state.

Further, in the present description, term "connected" is used to designate a direct electric connection, with no intermediate electronic component, for example, by means of a conductive track, and term "coupled" or term "linked" will be used to designate either a direct electric connection (then meaning "connected") or a connection via one or a plurality of intermediate components (resistor, capacitor, etc.).

Further, in the present description, the same reference is used to designate an electronic component in the drawings and to designate a property, the resistance or the capacitance, of this electronic component. Further, the potential at a node N1 is noted V(N1) and the voltage between two nodes N2 and N3 is noted V(N2, N3) or V(N2)−V(N3).

Further, in the present description, when it is described that a switch is controlled by a binary signal, it is considered as an example that the switch is on when signal binary is at "1" and that the switch is off when the binary signal is at "0". The switch may correspond to a MOS transistor having its gate controlled by the binary signal.

The inventors have shown that the use of a summing circuit having a large dynamic range may enable to increase the signal-to-noise ratio of a terahertz imager.

A terahertz imager or terahertz image sensor comprises an array of sensors, each capable of detecting a terahertz radiation. Each sensor, also called pixel, defines the spatial resolution of the imager. The field of terahertz frequencies approximately extends from 100 GHz to 30 THz, which corresponds to wavelengths in the range from 0.01 mm to 3 mm. Terahertz radiations have a strong penetration power.

They potentially enable to see through many non-conductive materials such as the skin, clothes, paper, wood, cardboard, plastics, etc. Terahertz waves may be used in imaging in the same way as infrared radiation, in radio astronomy, in planetary radiometry and in meteorological soundings.

Figure 2:
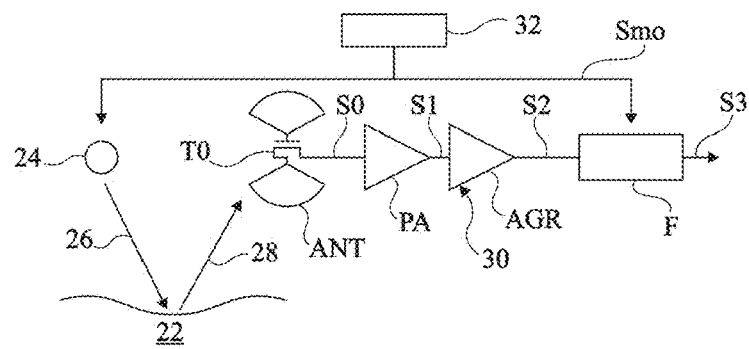
FIG. 2 is a diagram showing a terahertz image detection system.

FIG. 2 partially and schematically shows a system 20 for determining a terahertz image of a scene 22. System 20 comprises a source 24 of a terahertz radiation 26 which reflects on scene 22. System 20 further comprises an array of detectors of the terahertz radiation 28 reflected by scene 22, a single detector 30 being shown in FIG. 2. Generally, the signal received by detector 30 is of low amplitude and requires a processing to be extracted from the noise.

There exist many different types of terahertz radiation detection methods. Direct detection methods provide a signal which is representative of the intensity of the terahertz radiation. Direct detection methods may use pneumatic detectors, particularly Golay cells, pyroelectric detectors, Schottky diodes, bolometers, terahertz detectors based on field-effect transistors. Indirect or coherent detection methods comprise modulating the terahertz radiation with an oscillating signal at a reference frequency and filtering the received signal at the reference frequency.

In FIG. 2, a generator 32 of an oscillating signal Smo at a low frequency fmo, which for example varies from 1 kHz to 10 MHz, and having a constant peak-to-peak amplitude, has been shown, signal Smo being transmitted to source 22 and to detector 30. Terahertz radiation 26 is amplitude-modulated by signal Smo. Each detector 30 receives the amplitude-modulated reflected terahertz wave 28 at frequency fmo. As an example, for each detector 30, the terahertz wave is detected by a matched antenna ANT coupled with a MOS transistor T0 which supplies a signal S0. Each detector 30 comprises a low-noise preamplifier PA receiving signal S0 and supplying a signal S1 and having the function of amplifying signal S0 while adding as little noise as possible thereto. Each detector 30 further comprises an adjustable gain amplifier AGR receiving signal S1 and supplying a signal S2 and which enables to adapt the level of signal S2 according to external instructions. An optimal signal S2 relative to noise having a power density which cannot be decreased is then available. Each detector 30 further comprises a highly-selective filter F centered on modulation frequency fmo receiving signal S2 and supplying a signal S3. As an example, filter F corresponds to the synchronous filter described in patent application WO 2015040316. Signal S3 is an oscillating signal at frequency fmo which has a peak-to-peak amplitude which depends on the distance between detector 30 and scene 22 and on the reflective power of scene 22. The amplitude of signal S3 may be very low, for example, in the order of 1 μV, and close to the thermal noise. An image, called terahertz image, may be determined from the signals S3 supplied by detector array 30. The imager may supply images at a frequency Ftram. As an example, the imager may supply 10 images per second, which corresponds to a frame period Ttram of 100 ms.

Although filter F enables to increase the signal-to-noise ratio (SNR) of signal S3 with respect to signal S2, it would be desirable to further increase the signal-to-noise of the terahertz imager.

The inventors have shown that to improve the signal-to-noise ratio of the terahertz imager, the fact that the peak-to-peak amplitude of signal S3 is substantially constant for a frame period Ttram may be used. During each frame period Ttram, there are Ttram*fmo oscillations of signal S3, which corresponds to $10^4$ periods of signal S3 when period Ttram is equal to 100 ms and frequency fmo is equal to 100 kHz. K samples, K being equal to $10^4$ in the present example, of a stationary signal (signal Sm0 used for the modulation has a constant peak-to-peak amplitude) tainted with noise, itself stationary (having a time-invariable average), are thus available. By summing the K samples, an increase in the signal-to-noise ratio equal to the square root of K, that is, 100 in the present example, can be obtained for the sum signal.

However, for the terahertz imager, determining the sum signal amounts to determining the sum of K elementary charge samples $Q_i$, where $Q_i$ may vary from 5 fC to 500 fC. Total charge $Q_{PE}$ may reach 5 nC, that is, 5,000 pF·V. The integrating circuit should thus have a dynamic range $Q_{PE}/Q_i$ equal to $10^6$, that is, 120 dB. An integrating circuit having the structure shown in FIG. 2 thus cannot be used for this purpose.

Figure 3:
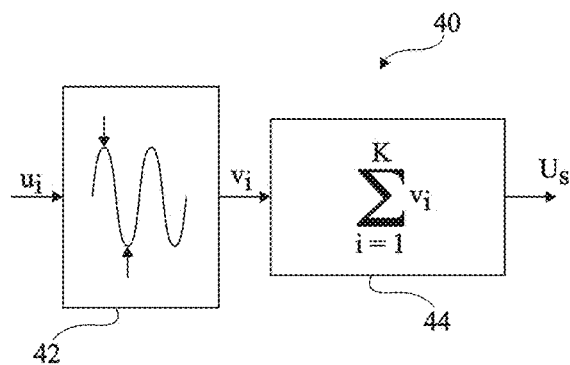
FIG. 3 partially and schematically shows an embodiment of a processing and sum determination circuit.

FIG. 3 shows an embodiment of a processing and sum determination circuit 40 which is capable of being used with the terahertz detector 30 previously described in relation with FIG. 2. Circuit 40 comprises:

an amplitude extraction circuit 42 receiving an oscillating signal $u_i$ and supplying a signal $v_i$ equal to the peak-to-peak amplitude of noisy signal $u_i$ over an oscillation of signal $u_i$; and a summing circuit 44 which receives sample $v_i$, adds it to the previous ones and provides a sum signal $U_S$ representative of the sum of K samples received during an integration period Tint.

According to an embodiment, integration period Tint is equal to frame period Ttram.

When processing and sum determination circuit 40 is used with the terahertz image determination system 20 previously described in relation with FIG. 2, signal $u_i$ corresponds to signal S3 supplied by detector 30.

According to an embodiment, instead of directly determining an analog signal having its amplitude proportional to the sum to be determined, summing circuit 44 increments a counter each time the sum to be determined increases by a determined elementary quantity. The final sum can then be obtained by the product of the counter and of the elementary quantity. To achieve this, summing circuit 44 alternately increases and decreases an analog signal each time the sum of the input charge samples exceeds the elementary quantity. The counter is then incremented each time the direction of the variation of the analog signal changes. Everything occurs as if the total sum signal was aliased into an "aliased" signal having a limited peak-to-peak amplitude. The aliasing operation may be performed by a hysteresis comparator. By aliasing the sum of the charge samples, the summing circuit enables to obtain the 5,000-V·pF dynamic range.

Amplitude extraction circuit 42 supplies the samples having their sum desired to be determined. In the present embodiment, the samples correspond to the peak-to-peak amplitude of an oscillating signal. However, according to the nature of the signal received by processing and sum determination circuit 40, amplitude extraction circuit 42 may be replaced with another type of preprocessing circuit. In particular, when the signal received by processing and sum determination circuit 40 directly corresponds to a succession of constant values, processing and sum determination circuit 40 may comprise summing circuit 44 only.

FIG. 4 partially and schematically shows an embodiment of amplitude extraction circuit 42.

Amplitude extraction circuit 42 comprises four blocks 50, 52, 54, and 56. Amplitude extraction circuit 42 is powered under a voltage Vdda, for example, equal to 1.2 V.

Block 50 comprises capacitors Ct and Cb. A plate of capacitor Ct is coupled to a node I via a switch SW1 controlled by a binary signal hmax and coupled to a node max via a switch SW2 controlled by a signal ser. The other plate of capacitor Ct is coupled to a node Vref via a switch SW3 controlled by binary signal $\overline{\text{ser}}$ (which is the signal complementary to binary signal ser). A plate of capacitor Cb is coupled to node I via a switch SW4 controlled by a binary signal hmin and coupled to a node min via a switch SW5 controlled by a signal ser. The other plate of capacitor Cb is coupled to node R via switch SW3. Node I receives signal $u_i$. Node R is kept at a constant potential. Signal $v_i$ corresponds to voltage V(max,min) between nodes max and min.

Block 52 receives signal $u_i$ and supplies a signal $-du_i/dt$ equal to the time derivative of signal $u_i$. Block 52 for example comprises an RC circuit and an operational amplifier.

Block 54 comprises a first comparator CMP1 receiving on a first input a high comparison threshold hi and receiving on a second input signal $-du_i/dt$ and supplying a binary signal CP1 in a first state, for example, "1", when signal $-du_i/dt$ is smaller than high comparison threshold hi, and in a second state, for example, "0", when signal $-du_i/dt$ is greater than high comparison threshold hi. Block 54 comprises a second comparator CMP2 receiving on a first input signal $-du_i/dt$ and receiving on a second input a low comparison signal lo and supplying a binary signal CP2 in a first state, for example, "1", when signal $-du_i/dt$ is greater than low comparison threshold lo and in a second state, for example, "0", when signal $-du_i/dt$ is smaller than low comparison threshold lo.

Block 56 is a logic circuit receiving binary signals CP1 and CP2 and supplying control signals hmax, hmin, and ser.

The operation of amplitude extraction circuit 42 comprises a succession of cycles for each period Tmo equal to 1/fmo.

FIG. 5 shows curves of the variation of signals $u_i$, $-du_i/dt$, hmax, hmin, and ser during two operating cycles of amplitude extraction circuit 42. Call t1, t2, t3, and t4 successive times.

Logic circuit 56 is defined so that only one of signals hmax, hmin, and ser is at state "1" at a time. Logic circuit 56 sets signal hmax to "1" for a determined period little after signal $-du_i/dt$ exceeds threshold hi so that the falling edge of signal hmax occurs when signal $u_i$ crosses a maximum, which corresponds to times t1 and t3 in FIG. 5. Logic circuit 56 sets signal hmin to "1" for a determined period little after signal $-du_i/dt$ decreases under threshold lo so that the falling edge of signal hmin occurs when signal $u_i$ crosses a minimum, which corresponds to times t2 and t4 in FIG. 5. Logic circuit 56 sets signal ser to "1" for a determined period between the last falling edge of signal hmin and the next rising edge of signal hmax.

When signal hmax is equal to "1" and signal ser is at "0", switches SW1 and SW3 and turned on and capacitor Ct is charged with voltage V($u_i$,ref). When signal hmax switches from "1" to "0", the maximum value V(max) of signal $u_i$ is sampled from capacitor Ct. When signal hmin is equal to "1" and signal ser is at "0", switches SW4 and SW3 and turned on and capacitor Cp is charged with voltage V(ref,$u_i$). When signal hmin switches from "1" to "0", the maximum value V(min) of signal $u_i$ is sampled from capacitor Cp. When signal ser is at "1", capacitors Ct and Cp are series-connected and peak-to-peak voltage V(max,min) is applied between nodes max and min and supplied to summing circuit 44.

Amplitude extraction circuit 42 advantageously performs a correlated double sampling on signal $u_i$, thus filtering unwanted low frequencies smaller than half frequency fmo.

Further, sampling noise kT/C of amplitude extraction circuit 42 is negligible over period Ttram. Indeed, for a 1-pF sampling capacitance, sampling noise kT/C is equal to 64 μV multiplied by the square root of 2 since there are two samples per cycle. This results in a noise kT/C of 90 μV, decreased by the $10^4$ samples to 0.9 μV at the end of the frame.

Figure 6:
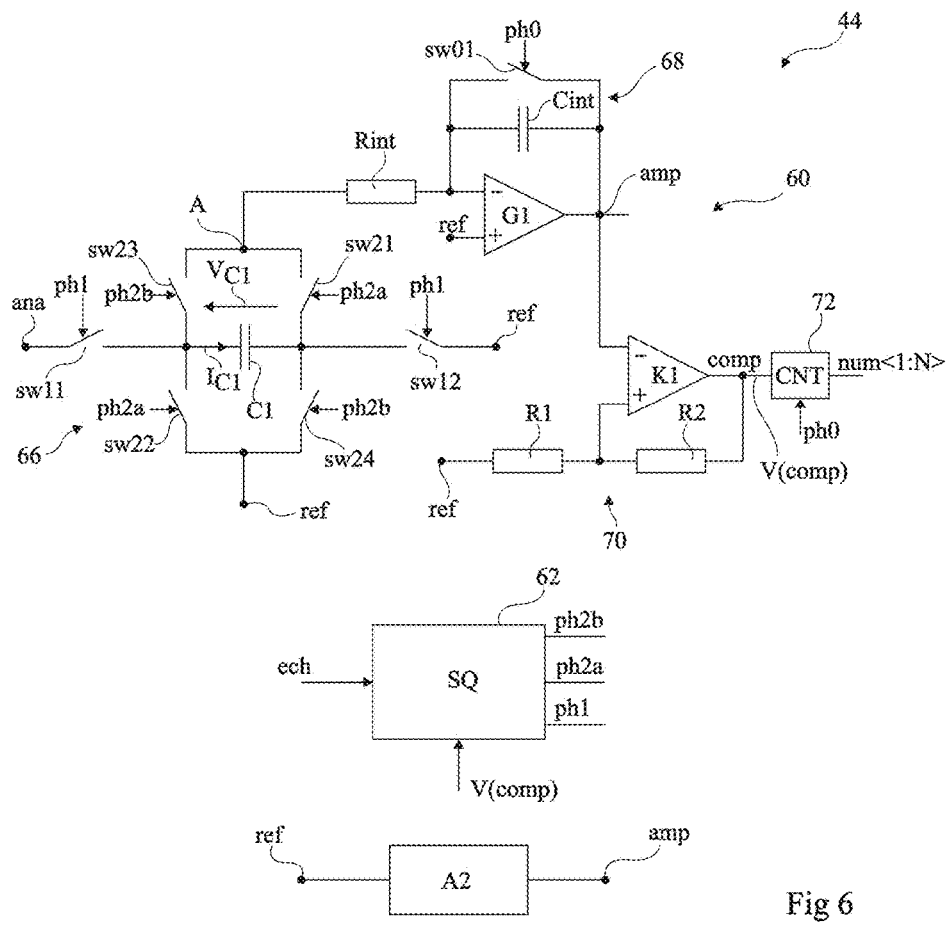
FIG. 6 partially and schematically shows an embodiment of a summing circuit of the processing and sum determination circuit of FIG. 3.

FIG. 6 partially and schematically shows an embodiment of summing circuit 44.

Summing circuit 44 comprises two blocks 60 and 62. Summing circuit 44 is powered with power supply voltage Vdda, for example, equal to 1.2 V.

Block 60 successively comprises a capacitance switch 66, an integrator 68, a hysteresis comparator 70, and a counter 72.

Capacitance switch 66 comprises an input node ana receiving a plurality of successive signals $v_i$, to be summed. Block 60 comprises a capacitor C1 having a plate coupled to node ana by a switch sw11 controlled by a binary signal ph1. This plate is further coupled to a node ref by a switch sw22 controlled by a binary signal ph2a and is coupled to a node A by a switch sw23 controlled by a binary signal ph2b. The plate of capacitor C1 is coupled to node ref by a switch sw12 controlled by signal ph1. This plate is also coupled to node A by a switch sw21 controlled by signal ph2a and to node ref by a switch sw24 controlled by signal ph2b. The voltage across capacitor C1 is called $V_{C1}$ and the current flowing through capacitor C1 is called $I_{C1}$.

Integrator 68 comprises a resistor Rint having a terminal coupled to node A and having its other terminal coupled to the inverting input (−) of an operational amplifier G1. The non-inverting input (+) of operational amplifier G1 is coupled to node ref. Integrator 68 further comprises a capacitor Cint having a plate coupled to the inverting input (−) of operational amplifier G1, the other plate of capacitor Cint being coupled to output amp of operational amplifier G1. A switch sw01 controlled by a binary signal ph0 is provided across capacitor Cint.

Integrator 68 may further comprise an auto-zero circuit AZ connected to nodes ref and amp, having the function of suppressing the offset of amplifier G1. Auto-zero circuit AZ may be omitted.

Hysteresis comparator 70 comprises a comparator K1 comprising a negative input (−) coupled to output amp of amplifier G1 and comprising a positive input (+) coupled to a node th. Block 60 comprises a resistor R1 having a terminal coupled to node ref and having its other terminal coupled to node th. Block 60 comprises a resistor R2 having a terminal coupled to node th and having its other terminal coupled to output comp of comparator K1. Comparator K1 supplies a binary signal V(comp) which can take two states, noted Vdd and 0 hereafter.

Counter 72 comprises a binary counter CNT receiving signal V(comp), receiving signal ph0 and supplying a digital signal num comprising N bits, where N is an integer which may vary from 1 to 20. According to an embodiment, N is selected according to the required dynamic range DYN expressed in dB according to the following relation (2):

$$N = DYN/(20 * \log 2) \qquad (2)$$

where log is the decimal logarithm.

As a variation, binary counter CNT may be replaced with a decimal counter or any other type of counter. Counter CNT increments signal num by one unit for each rising transition and each falling transition of signal V(comp). Binary signal num may be transmitted to a processing circuit, which may be external to the terahertz imager. As an example, the determination of a terahertz image may be performed from the binary signals num received for all detectors.

Block 62 comprises a sequencer receiving a signal ech and signal V(comp) and supplying signals ph1, ph2a, and ph2b. Sequencer 62 may operate according to a finite automaton.

In operation, voltage V(max)−V(min) supplied by amplitude extraction circuit 42 is applied between nodes ana and ref of summing circuit 44. Node min of amplitude extraction circuit 42 is thus connected to node ref, having its potential set by a voltage source, for example, to Vdda/2. In operation, signal ech corresponds to signal ser supplied by amplitude extraction circuit 42.

According to an embodiment, node max of amplitude extraction circuit 42 is directly coupled to input ana of summing circuit 44. There then is a sharing of electric charges between equivalent capacitor Cex at the output of amplitude extraction circuit 42 and capacitor C1 of summing circuit 44, capacitance Cex of the equivalent capacitor being provided by the following relation (3):

$$Cex=(Ct·Cb)/(Ct+Cb) \quad (3)$$

In the case where Cb is equal to Ct, capacitance Cex is equal to Ct/2. It may be advantageous to select Cex greater than C1 by at least a factor 10 to avoid too strongly attenuating the electric charge transferred to capacitor C1.

According to another embodiment, node max of amplitude extraction circuit 42 is coupled to input ana of summing circuit 44 via a voltage follower having a high input impedance and a low output impedance. There thus is no attenuation of the charge transferred to capacitor C1. However, the follower consumes little power and surface area.

Figure 7:
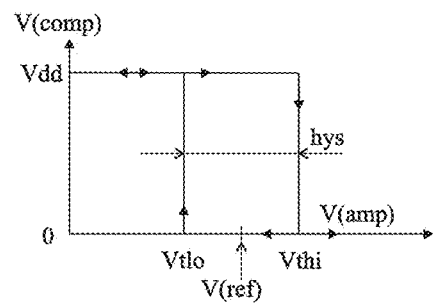
FIG. 7 is a curve of the variation of a signal supplied by a hysteresis circuit of the summing circuit of FIG. 6 according to the signal received by the hysteresis circuit.

FIG. 7 is a curve of the variation of signal V(comp) supplied by hysteresis comparator 70 according to potential V(amp) and illustrates the operation of hysteresis comparator 70. Potential V(amp) is referenced to ground, taken equal to 0 V. When potential V(amp) is at 0 V, potential V(comp) is at Vdd. Potential V(comp) remains equal to Vdd when V(amp) increases from 0 V until V(amp) exceeds a threshold $V_{thi}$. Potential V(comp) then switches to 0. When potential V(amp) decreases from a value greater than $V_{thi}$, potential V(comp) remains at 0 until V(amp) decreases below a threshold $V_{tlo}$. Potential V(comp) then switches to Vdd. Thresholds $V_{thi}$ and $V_{tlo}$ are provided by the following relations (4):

$$V_{thi}=V(\text{ref})+\text{hys}/2$$

$$V_{tlo}=V(\text{ref})-\text{hys}/2$$

$$\text{hys}=Vdd*R1/(R1+R2) \quad (4)$$

Figure 8:
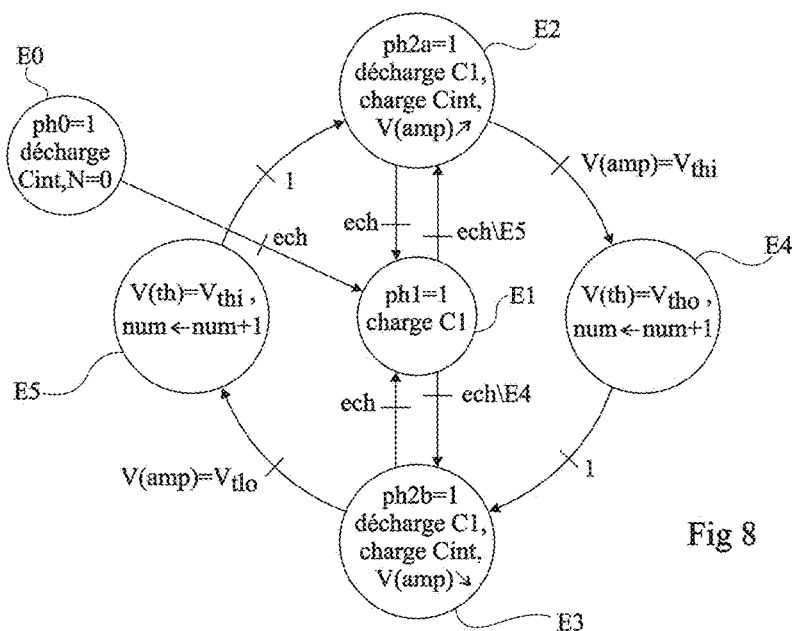
FIG. 8 shows an embodiment of an operation diagram of the summing circuit of FIG. 6.

FIG. 8 shows an embodiment of the operation diagram of summing circuit 44 comprising states E0, E1, E2, E3, E4, and E5. The succession of states is repeated for each frame.

Summing circuit 44 starts at state E0 where signals ph1, ph2a, and ph2b are at "0". Signal ph0, which may be supplied by an external circuit to the terahertz imager, is at "1", which resets to zero the charge stored in integration capacitor Cint. Sequencer 62 crosses state E0 only once at the beginning of the frame. State E0 typically lasts for a few nanoseconds, which duration may be determined by a monostable trigger circuit.

Summing circuit 44 switches from state E0 to state E1 when signal ech switches from state "0" to state "1". At state E1, signal ph1 is at "1", signals ph2a and ph2b being at "0". Capacitor C1 is charged with voltage V(ana,ref). The charge period may last from 10 ns to 50 ns.

Summing circuit 44 switches from state E1 to state E2 when signal ech switches from state "1" to state "0" while signal V(th) is equal to $V_{thi}$. At state E2, signal ph2a is at "1", signals ph1 and ph2b being at "0". There is a discharge of capacitor C1 and a charge of capacitor Cint. Potential V(amp) increases. Summing circuit 44 switches from state E2 to state E1 when signal ech switches from state "0" to state "1".

Summing circuit 44 switches from state E1 to state E3 when signal ech switches from state "1" to state "0" while signal V(th) is at $V_{tlo}$. At state E3, signal ph2b is at "1", signals ph1 and ph2a being at "0". There is a discharge of capacitor C1 and a discharge of capacitor Cint. Potential V(amp) decreases. Summing circuit 44 switches from state E3 to state E1 when signal ech switches from state "0" to state "1".

Summing circuit 44 switches from state E2 to state E4 when signal V(amp), which increases, reaches $V_{thi}$. At state E4, signal V(comp) switches from Vdd to 0. Further, signal V(th) switches from $V_{thi}$ to $V_{tlo}$ and digital signal num is incremented by "1".

Summing circuit 44 switches from state E3 to state E5 when signal V(amp), which decreases, reaches $V_{tlo}$. At state E5, signal V(comp) switches from 0 to Vdd. Further, signal V(th) switches from $V_{tlo}$ to $V_{thi}$ and digital signal num is incremented by "1". Summing circuit 44 then switches from state E5 to state E2.

According to another embodiment, summing circuit 44 may directly pass from state E2 to state E3 when signal V(amp), which increases, reaches $V_{thi}$ and the discharge of capacitor C1 is not complete.

According to another embodiment, summing circuit 44 may directly pass from state E3 to state E2 when signal V(amp), which decreases, reaches $V_{tlo}$ and the discharge of capacitor C1 is not complete.

Resistor Rint aims at limiting the discharge current of capacitor C1 and is selected to be such that product Rint·C1 is smaller than period Tmo by at last a factor ten to ensure the full discharge of capacitor C1 between two samples.

Figure 9:
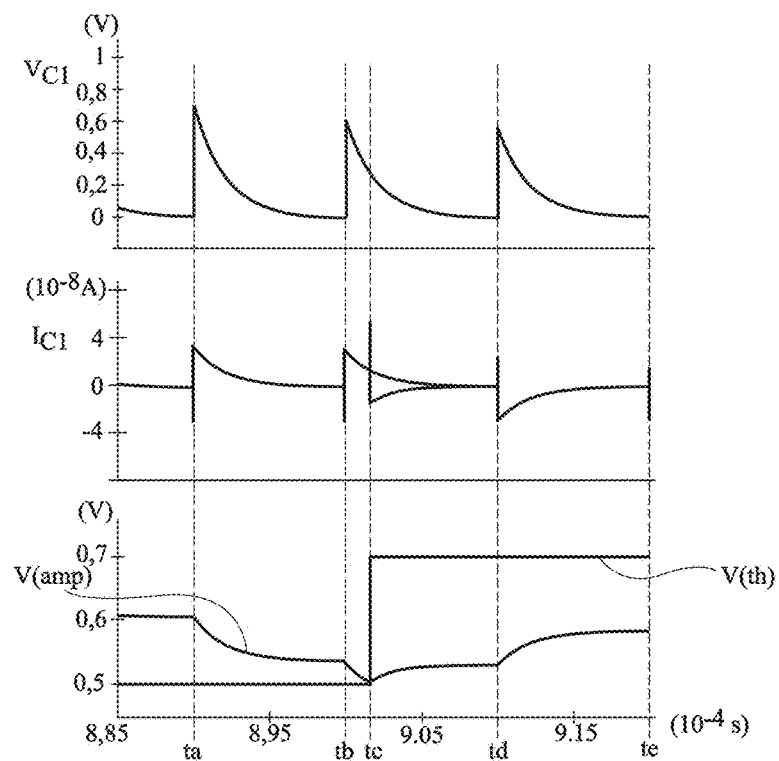
FIG. 9 shows curves of the variation of signals during the operation of the summing circuit of FIG. 6.

FIG. 9 shows curves of the time variation of voltage $V_{C1}$, of current $I_{C1}$, of potential V(amp), and of potential V(th). Times ta, tb, tc, td, and te are successive times. At 8.85 $10^{-4}$ s, potential V(th) is at low threshold $V_{tlo}$ equal to 0.5 V in this example.

At times ta and tb, signal ech switches to "1", which corresponds to the application of a new sample $v_i$ at the input of summing circuit 44. Summing circuit 44 then switches to state E1 and what corresponds to the charge of capacitor C1. An increase in absolute value of voltage $V_{C1}$ at each time ta and tb can thus be observed. The falling edge of signal ech controls the passing of summing circuit 44 to state E3 since signal V(th) is at $V_{tlo}$. The discharge of capacitor C1 can thus be observed, with a decrease in absolute value of voltage $V_{C1}$ between times ta and tb, and between times tb and tc.

At time tc, signal V(comp) switches from the low state to the high state when potential V(amp), which was decreasing up to then, reaches low threshold $V_{tlo}$. This corresponds to the passing from state E3 to state E5 where counter 72 increments binary signal num. Further, potential V(th) then switches from $V_{tlo}$ to $V_{thi}$. Summing circuit 44 then passes from state E5 to state E2 where the connection of capacitor C1 is reversed with respect to that of state E3. The sign of current $I_{C1}$ reverses, the current continuing its discharge, and potential V(amp) increases after time tc.

At times td and te, signal ech switches to "1", which corresponds to the application of a new sample $v_i$ at the input of summing circuit 44. Summing circuit 44 then switches to state E1, and thus to the charge of capacitor C1. An increase in absolute value of voltage $V_{C1}$ at each time td and te can thus be observed. The falling edge of signal ech controls the passing of summing circuit 44 to state E2 since signal V(th) is at $V_{thi}$. The discharge of capacitor C1 can thus be observed, with a decrease in absolute value of voltage $V_{C1}$ between times td and te.

Figure 10:
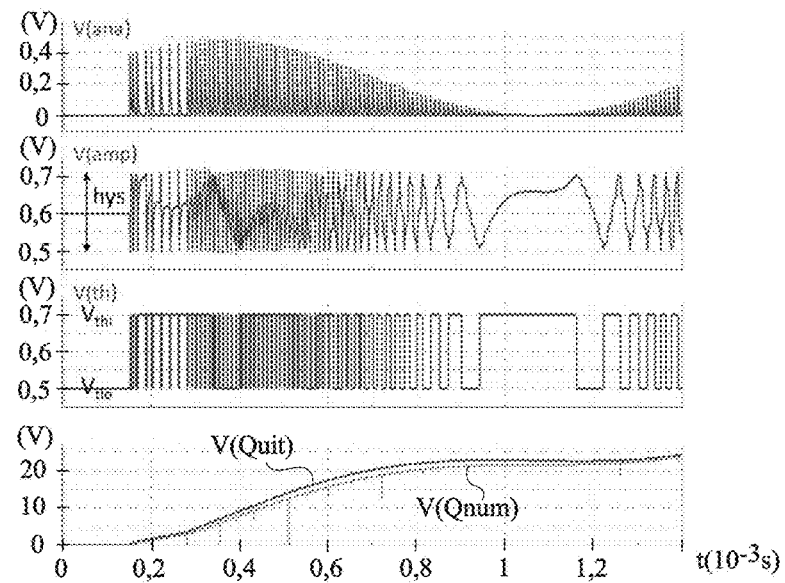
FIG. 10 shows curves of the variation of signals illustrating the operation of the processing and sum determination circuit of FIG. 3.

FIG. 10 shows curves of the time variation of signal V(ana), of signal V(amp), and of signal V(th) over a larger time scale than in FIG. 9. Further, FIG. 10 shows a time variation curve of V(Qnum) which corresponds to product Cint*hys*num and a time variation curve V(Qwit), obtained by simulation, supplied by the integrator circuit having the structure shown in FIG. 1 in the absence of physical stress. In FIG. 10, the peak-to-peak amplitude of signal V(ana) varies rapidly over time to show the proper operation of summing circuit 44. However, in the case of a terahertz imager, signal V(ana) varies little over a frame.

Each peak of signal V(ana) corresponds to the transmission to summing circuit 44 of a new sample $v_i$ to be summed. The variation curve of signal V(amp) reflects the aliasing by the hysteresis comparator of the sum signal to be determined. Each switching of signal V(th) corresponds to an increment of binary counter num.

The difference between the two curves V(Qnum) and V(Qwit) results from the imperfections of the electronic circuit forming processing and sum determination circuit 40 (particularly, the non-zero switching time of amplifier G1, of comparator K1, and of the switches).

In this example, a 25-V·pF charge Qwit calculated by processing and sum determination circuit 40 at time t equal to 1 ms is obtained, while all the voltages of this circuit have varied in absolute value from 0 to Vdda (for example, equal to 1.2 V).

Figure 11:
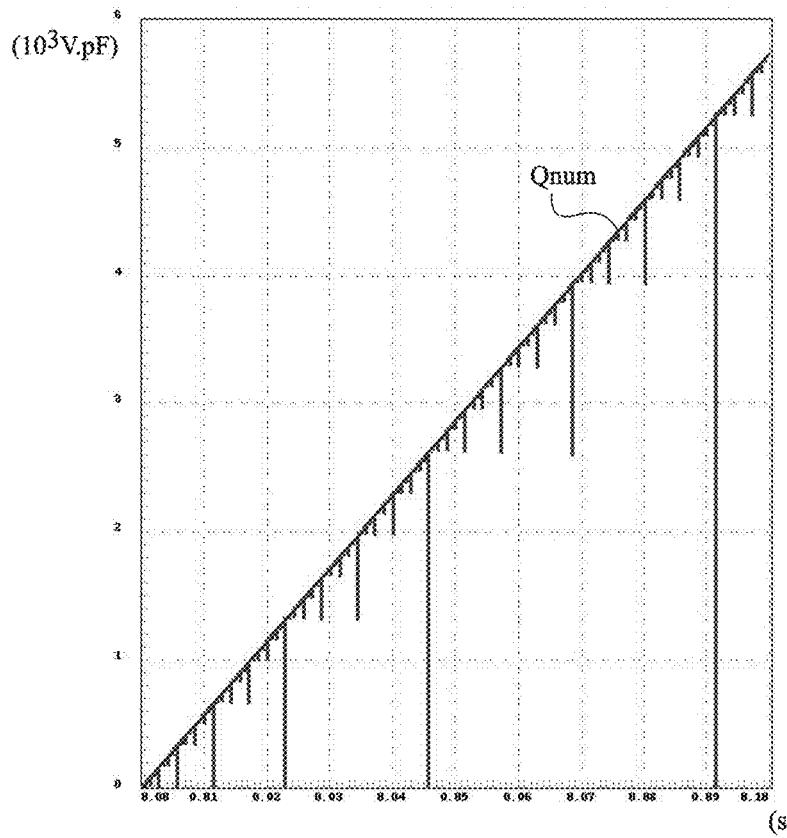
FIG. 11 shows a curve of the variation of the electric charge determined from signals supplied by the processing and sum determination circuit of FIG. 3 for other operating parameters.

FIG. 11 shows a curve of the variation of the electric charge Qnum determined from signal num supplied by processing and sum determination circuit 40 of FIG. 3 in the case where integration period Tint is equal to 100 ms, with samples $v_i$ having a constant amplitude equal to 0.6 V, a modulation frequency fmod equal to 100 kHz, a hysteresis voltage hys equal to 0.6 V, and capacitances C1 and Cint equal to 1 pF.

The expected theoretical value of the electric charge is thus equal to product Cint·hys·$10^4$ is 6,000 V·pF. In FIG. 11, curve Qnum, at time t equal to 100 ms, exceeds value in ordinates 5,700 V·pF, that is, 95% of the theoretical value. As for the example illustrated in FIG. 10, the difference is due to the imperfections of the electronic circuit forming processing and sum determination circuit 40.

Summing circuit 44 according to the previously-described embodiments enables to determine sum $\Sigma_{i=1}^{K} Q_i$, where Qi is the charge of a sample and is in the range, for example, from 1 fC to 500 fC, and K is the number of samples to be summed and is an integer greater than 1, for example, in the range from 1 to 10,000.

The resolution of summing circuit 44 corresponds to the minimum detectable electric charge Qmin which is equal to product Cint·hys. Minimum electric charge Qmin is determined by integration capacitance Cint and hysteresis hys. As an example, Qmin is equal to 200 fC, Cint being equal to 1 pF, and hys being equal to 200 mV.

Generally, minimum charge Qmin may be in the order of some hundred femtocoulombs and total electric charge $Q_{PE}$ may be in the order of several nanocoulombs. The measurable dynamic range is greater than 90 dB, preferably greater than 100 dB.

Summing circuit 44 has the following advantages:

summing circuit 44 has a large dynamic range;

the flow of sample transmission to summing circuit 44 may be sporadic or regular;

the samples may have a variable amplitude;

the power consumption of processing and sum determination circuit 40 may be lower than 60 µW. This enables to form processing and sum determination circuit 40 in integrated fashion with detector 30; and summing circuit 44 directly supplies a digital signal, which enables to avoid using an analog-to-digital converter.

The invention claimed is:

1. A summing circuit comprising:
a capacitor comprising first and second plates;
a switching circuit capable of connecting the capacitor according to a first, a second, or a third configuration, the first plate being connected to a first node, the second plate being connected to a second node and the first and second plates not being connected to a third node in the first configuration, the first plate being connected to the third node, the second plate being connected to the second node and the first and second plates not being connected to the first node in the second configuration and the second plate being connected to the third node, the first plate being connected to the second node and the first and second plates not being connected to the first node in the third configuration;
an integrator coupled to the third node;
a hysteresis comparator coupled to the output of the integrator; and
a counter coupled to the output of the hysteresis comparator.

2. The summing circuit of claim 1, wherein the integrator is capable of supplying a first signal and wherein the hysteresis comparator is capable of supplying a second signal in a first state or in a second state according to the result of the comparison of the first signal with a first threshold or with a second threshold.

3. The summing circuit of claim 2, wherein the counter is capable of incrementing a digital signal for each rising edge and for each falling edge of the second signal.

4. The summing circuit of claim 1, wherein the integrator comprises an operational amplifier.

5. The summing circuit of claim 1, wherein the switching circuit comprises:
a first switch coupling the first plate of the capacitor to the first node and controlled by a first control signal;
a second switch coupling the second plate of the capacitor to the second node and controlled by the first control signal;
a third switch coupling the first plate of the capacitor to the third node and controlled by a second control signal;
a fourth switch coupling the second plate of the capacitor to the second node and controlled by the second control signal;
a fifth switch coupling the first plate of the capacitor to the third node and controlled by a third control signal; and
a sixth switch coupling the second plate of the capacitor to the second node and controlled by the third control signal.

6. The summing circuit of claim 5, further comprising a sequencer capable of controlling the first, second, third, fourth, fifth, and sixth switches according to one of the following configurations a), b), and c):
   a) first and second switches on and third, fourth, fifth, and sixth switches off;
   b) third and fourth switches on and first, second, fifth, and sixth switches off; and
   c) fifth and sixth switches on and first, second, third, and fourth switches off.

7. The summing circuit of claim 6, wherein the sequencer is capable of controlling the first, second, third, fourth, fifth, and sixth switches to configuration a) when a new value is applied between the first and second nodes.

8. The summing circuit of claim 7, wherein the integrator is capable of supplying a first signal, wherein the hysteresis comparator is capable of supplying a second signal in a first state or in a second state according to the result of the comparison of the first signal with a first threshold or with a second threshold and wherein the sequencer is capable of controlling the first, second, third, fourth, fifth, and sixth switches from configuration b) to configuration c) or from configuration c) to configuration b) when the signal reaches the first threshold or the second threshold.

9. A processing and sum determination circuit comprising a processing circuit capable of receiving a noisy analog signal and capable of supplying a succession of constant values based on the noisy analog signal; and
   the summing circuit of claim 1 capable of receiving the succession of constant values.

10. The processing and sum determination circuit of claim 9, wherein the analog signal is an oscillating signal and wherein the constant values are representative of the peak-to-peak amplitude to the analog signal for successive oscillations.

11. A system of detecting an electromagnetic radiation comprising an electromagnetic radiation detector and the processing and sum determination circuit of claim 9.

12. The detection system of claim 11, comprising an array of electromagnetic radiation detectors and, for each detector, a processing and sum determination circuit comprising a processing circuit capable of receiving a noisy analog signal and capable of supplying a succession of constant values based on the noisy analog signal; and
   a summing circuit of capable of receiving the succession of constant values, the summing circuit comprising:
   a capacitor comprising first and second plates;
   a switching circuit capable of connecting the capacitor according to a first, a second, or a third configuration, the first plate being connected to a first node, the second plate being connected to a second node and the first and second plates not being connected to a third node in the first configuration, the first plate being connected to the third node, the second plate being connected to the second node and the first and second plates not being connected to the first node in the second configuration and the second plate being connected to the third node, the first plate being connected to the second node and the first and second plates not being connected to the first node in the third configuration;
   an integrator coupled to the third node;
   a hysteresis comparator coupled to the output of the integrator; and
   a counter coupled to the output of the hysteresis comparator.

13. The detection system of claim 11, wherein the frequency of the electromagnetic radiation is in the range from 100 GHz to 30 THz.

* * * * *